(12) United States Patent
Kinoshita et al.

(10) Patent No.: US 8,692,264 B2
(45) Date of Patent: Apr. 8, 2014

(54) LIGHT-EMITTING ELEMENT, METHOD OF MANUFACTURING LIGHT-EMITTING ELEMENT, SELF-SCANNING LIGHT-EMITTING ELEMENT ARRAY, OPTICAL WRITING HEAD, AND IMAGE FORMING APPARATUS

(75) Inventors: Taku Kinoshita, Kanagawa (JP);
Michiaki Murata, Kanagawa (JP);
Takashi Kondo, Kanagawa (JP);
Kazutaka Takeda, Kanagawa (JP);
Hideo Nakayama, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 84 days.

(21) Appl. No.: 13/564,295

(22) Filed: Aug. 1, 2012

(65) Prior Publication Data
US 2013/0234168 A1 Sep. 12, 2013

(30) Foreign Application Priority Data
Mar. 7, 2012 (JP) ................................ 2012-049891

(51) Int. Cl.
*H01L 33/00* (2010.01)
*H01L 21/00* (2006.01)
(52) U.S. Cl.
USPC ........................ 257/88; 257/E33.055; 438/34
(58) Field of Classification Search
None
See application file for complete search history.

(56) References Cited

U.S. PATENT DOCUMENTS

| 5,451,977 A | 9/1995 | Kusuda et al. |
| 5,814,841 A | 9/1998 | Kusuda et al. |
| 6,614,055 B1 * | 9/2003 | Kusuda et al. .................. 257/79 |

FOREIGN PATENT DOCUMENTS

JP     A-1-238962     9/1989

* cited by examiner

*Primary Examiner* — Michael Lebentritt
*Assistant Examiner* — Kevin Quinto
(74) *Attorney, Agent, or Firm* — Oliff PLC

(57) ABSTRACT

Provided is a light-emitting element including a semiconductor substrate, an island structure formed on the semiconductor substrate and including at least a current confining layer and p-type and n-type semiconductor layers, a light-emitting thyristor formed in the island structure and having a pnpn structure, and a shift thyristor formed in the island structure and having a pnpn structure, wherein the island structure includes a first side surface having a first depth such that the first side surface does not reach the current confining layer in a formation region of the shift thyristor and a second side surface having a second depth such that the second side surface reaches at least the current confining layer in a formation region of the light-emitting thyristor, and an oxidized region selectively oxidized from the second side surface is formed in the current confining layer in the formation region of the light-emitting thyristor.

20 Claims, 20 Drawing Sheets

_US 8,692,264 B2_

LIGHT-EMITTING ELEMENT, METHOD OF MANUFACTURING LIGHT-EMITTING ELEMENT, SELF-SCANNING LIGHT-EMITTING ELEMENT ARRAY, OPTICAL WRITING HEAD, AND IMAGE FORMING APPARATUS

CROSS-REFERENCE TO RELATED APPLICATIONS

This application is based on and claims priority under 35 USC 119 from Japanese Patent Application No. 2012-049891 filed Mar. 7, 2012.

BACKGROUND (i) Technical Field

The present invention relates to a light-emitting element, a method of manufacturing the light-emitting element, a self-scanning light-emitting element array, an optical writing head, and an image forming apparatus.

(ii) Related Art

Surface light-emitting element arrays are used in a writing head of a contact image sensor, a printer, and the like. A typical surface light-emitting element array is configured by integrating multiple light-emitting elements arranged in a linear form on one substrate. As a typical example of a surface light-emitting element, a light-emitting diode (LED), a light-emitting thyristor, and a laser diode are known. Among these examples, a light-emitting thyristor has a configuration in which compound semiconductor layers of GaAs or AlGaAs are stacked in a pnpn structure, and an electric current flows between an anode and a cathode when a driving current is applied to a gate, whereby the light-emitting thyristor emits light.

SUMMARY

According to an aspect of the present invention, there is provided a light-emitting element including: a semiconductor substrate; an island structure formed on the semiconductor substrate and including at least a current confining layer and p-type and n-type semiconductor layers; a light-emitting thyristor formed in the island structure and having a pnpn structure; and a shift thyristor formed in the island structure and having a pnpn structure, wherein the island structure includes a first side surface having a first depth such that the first side surface does not reach the current confining layer in a formation region of the shift thyristor and a second side surface having a second depth such that the second side surface reaches at least the current confining layer in a formation region of the light-emitting thyristor, and an oxidized region selectively oxidized from the second side surface is formed in the current confining layer in the formation region of the light-emitting thyristor.

BRIEF DESCRIPTION OF THE DRAWINGS

Exemplary embodiments of the present invention will be described in detail based on the following figures, wherein:

FIG. 16 is an equivalent circuit of an SLED for explaining an operation when a parasitic thyristor is turned on;

DETAILED DESCRIPTION

Figure 1:
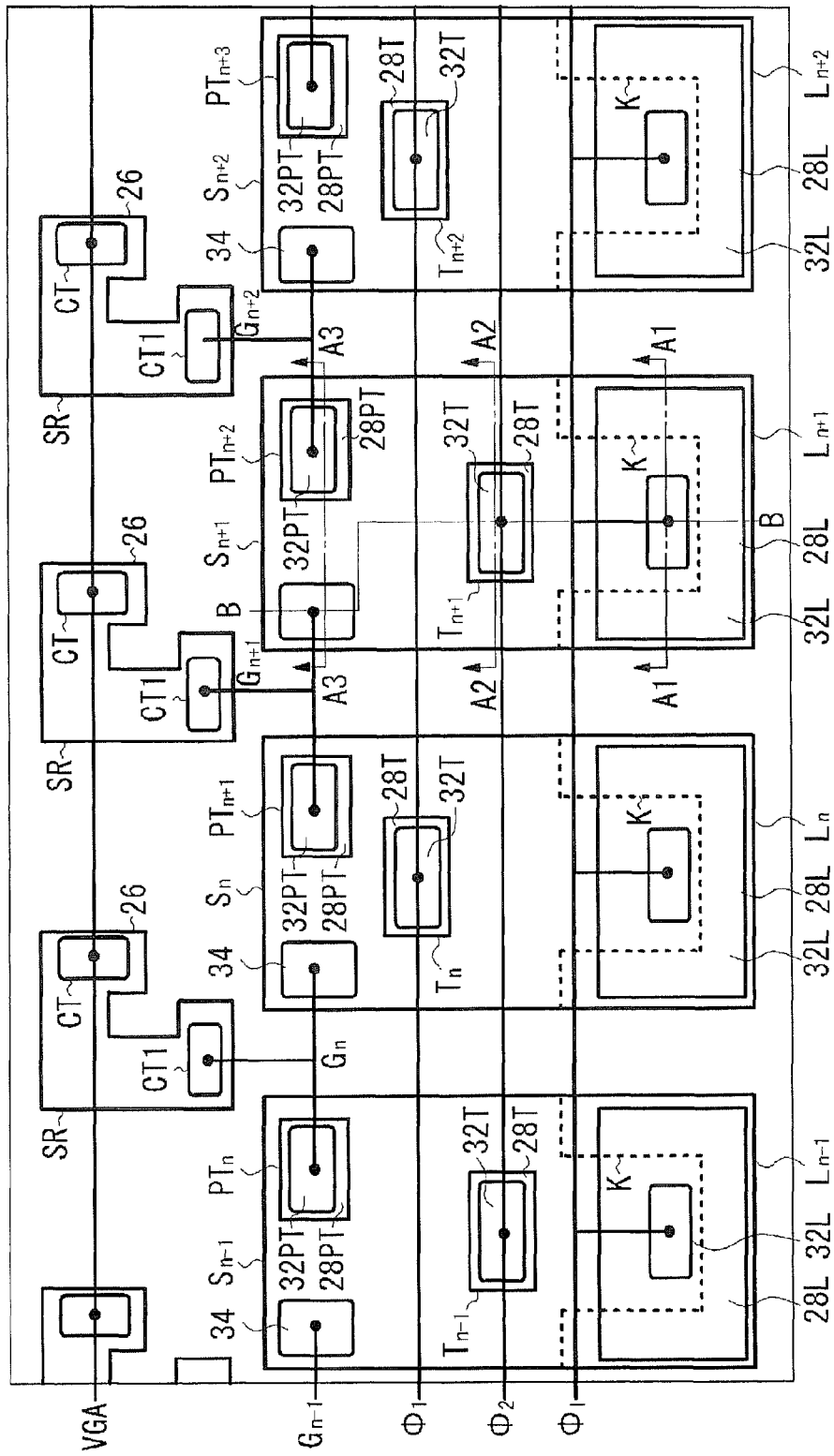
FIG. 1 is a plan view of a self-scanning light-emitting thyristor array according to an example of the present invention.

A light-emitting element array in which a number of light-emitting elements are integrated on the same substrate is combined with a driving circuit thereof and the like and is used in a light source that is used in a print head for an LED printer. In a light-emitting element array in which light-emitting diodes (LEDs) as light-emitting elements are arranged in one dimension, it is necessary to supply a signal corresponding to an image signal from an external driving circuit to respective LEDs. Thus, it is necessary to form bonding pads for supplying a voltage to respective LEDs on the substrate in the same number as the number of LEDs. However, since bonding pads generally have a large area, an increase in the area of a light-emitting element array chip is inevitable. When the chip size increases, since the number of chips obtainable from one wafer decreases, there is a limit in decreasing the cost.

For example, in a 1200-dpi printer head compatible with a printer for A3 paper, the number of LEDs arranged in one dimension is 14,000 or more, and it is necessary to bond wires to the bonding pads in the same number as the LEDs. The more the number of bonding wires, the higher the costs put into manufacturing the light-emitting element array. Further, when high-resolution light-emitting element arrays are manufactured in order to improve the quality of a printed image, the number of bonding pads increases, so that the number of bonding wires increases, the chip size further increases, and the cost increases. In addition to this, there is a limitation in the layout of bonding pads on the chip.

In a self-scanning light-emitting element array in which 3-terminal light-emitting thyristors sequentially generate firing pulses, when an anode is prepared in a substrate, a cathode is prepared in the uppermost n-type layer, and a gate is prepared in a p-layer immediately below the cathode layer, an electric current does not flow between the anode and the cathode unless a current more than a threshold value flows into the gate. A self-scanning light-emitting device (hereinafter referred to as an SLED) has a configuration in which shift thyristors and light-emitting thyristors are integrated on the same substrate. The shift thyristors are thyristors having such a property arranged in one dimension as switching elements. The light-emitting thyristors are thyristors arranged in one dimension as light-emitting elements.

In an SLED, it is not necessary to prepare bonding pads corresponding to respective light-emitting thyristors. When a rectangular voltage is supplied to bonding pads disposed on one side or both sides of a chip, the light-emitting thyristors may generate a firing pulse (perform self-scanning) sequentially starting from the one at the end of the chip. Thus, in the SLED, even when a resolution is increased, it is possible to bond the bonding pads to the end of the chip and to prevent an increase in the number of bonding pads, an increase in the chip size, and an increase in the cost due to an increase in the number of bonding wires.

Hereinafter, exemplary embodiments of the present invention will be described with reference to the drawings. In this exemplary embodiment, an SLED having pnpn-type light-emitting thyristors will be described as an example. A semiconductor layer that forms the pnpn-type light-emitting thyristors is formed of Group III-V compound semiconductors, and in this exemplary embodiment, GaAs, AlGaAs, and AlAs are used as an example of the compound semiconductor. It should be noted that the dimensions of some of the elements may be exaggerated relative to other elements for clarity, and elements shown in the figures have not necessarily been drawn to scale.

Exemplary Embodiments

Figure 2A:
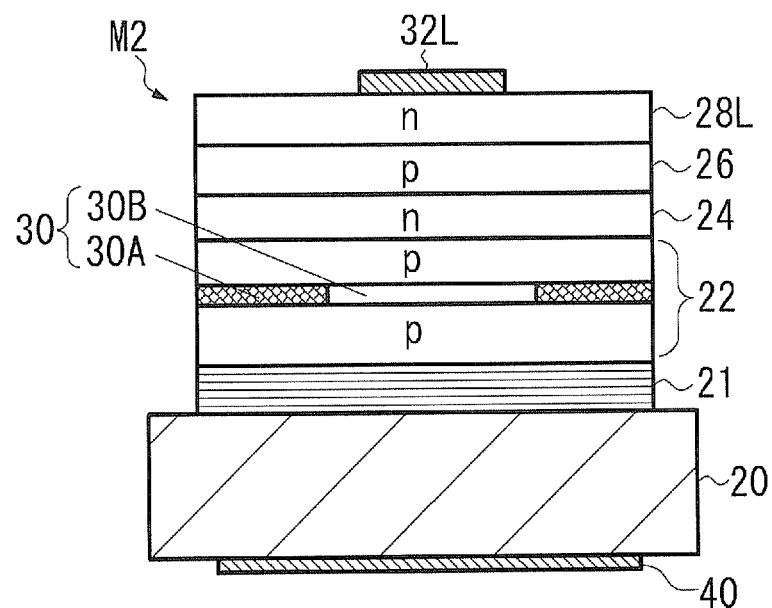
FIGS. 2A to 2C are cross-sectional views taken along lines A1-A1, A2-A2, and A3-A3 of FIG. 1.
Figure 2B:
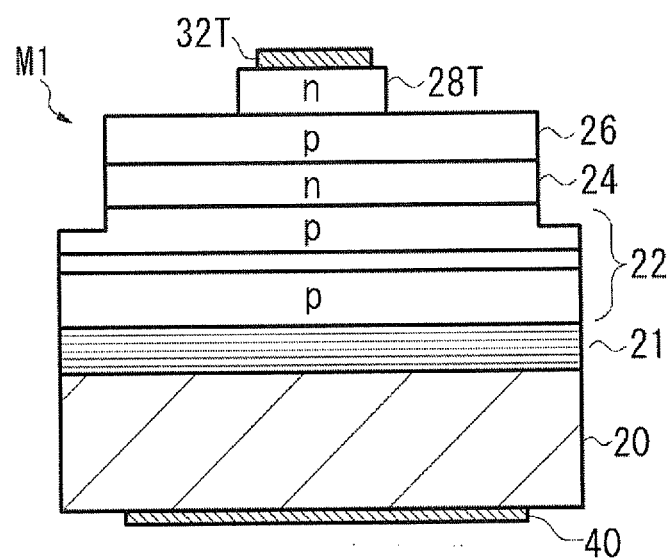
Figure 2C:
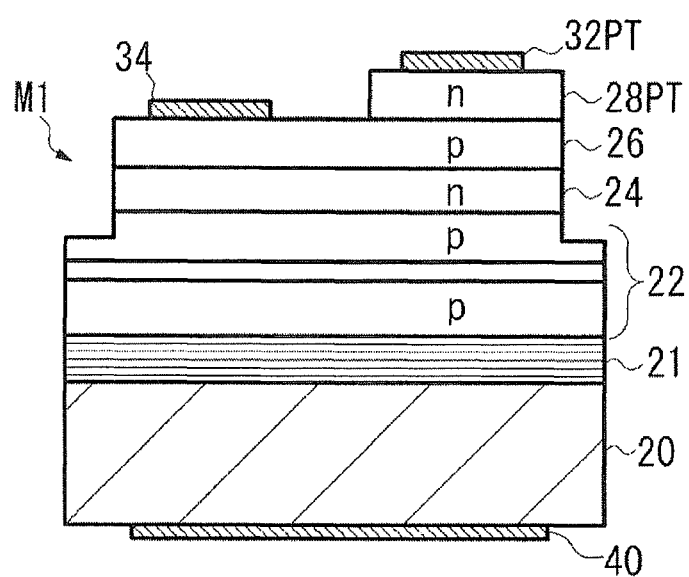
Figure 3:
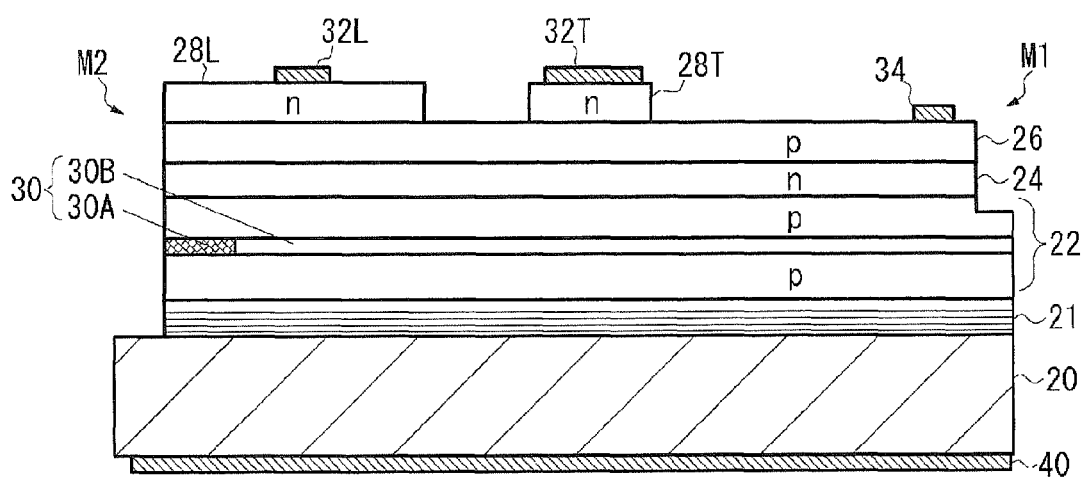
FIG. 3 is a cross-sectional view taken along line B-B of FIG. 1.
Figure 4:
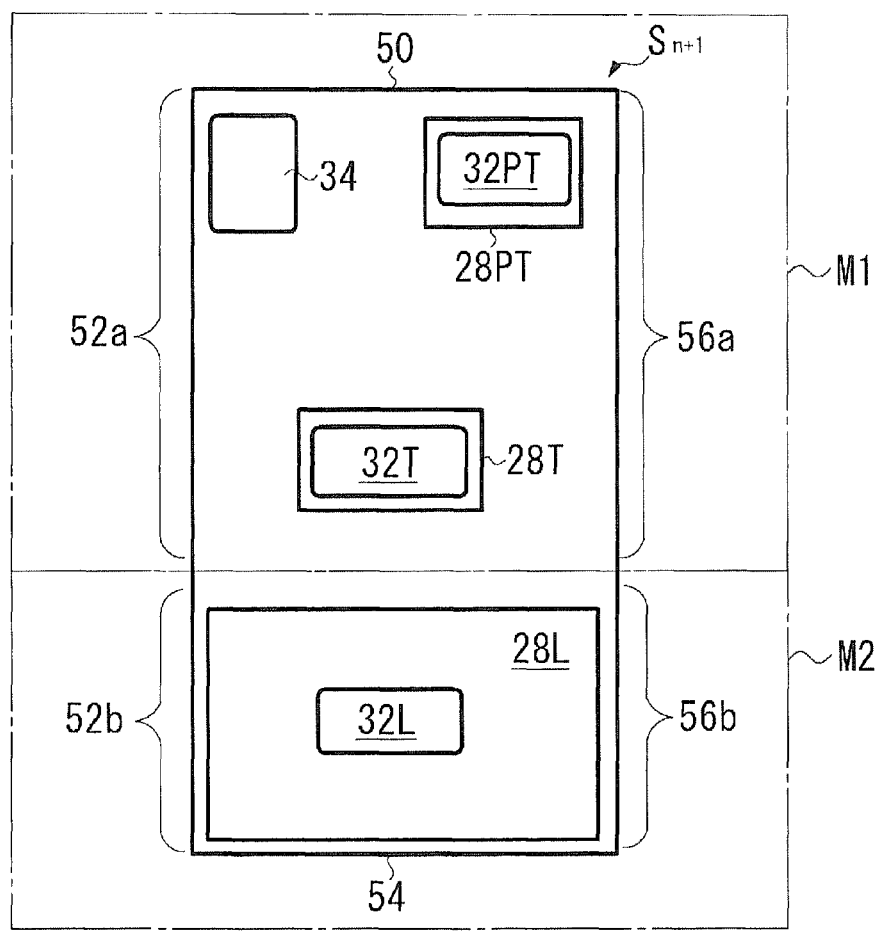
FIG. 4 is a plan view of an island Sn+1 for explaining first and second mesa structures M1 and M2.
Figure 5:
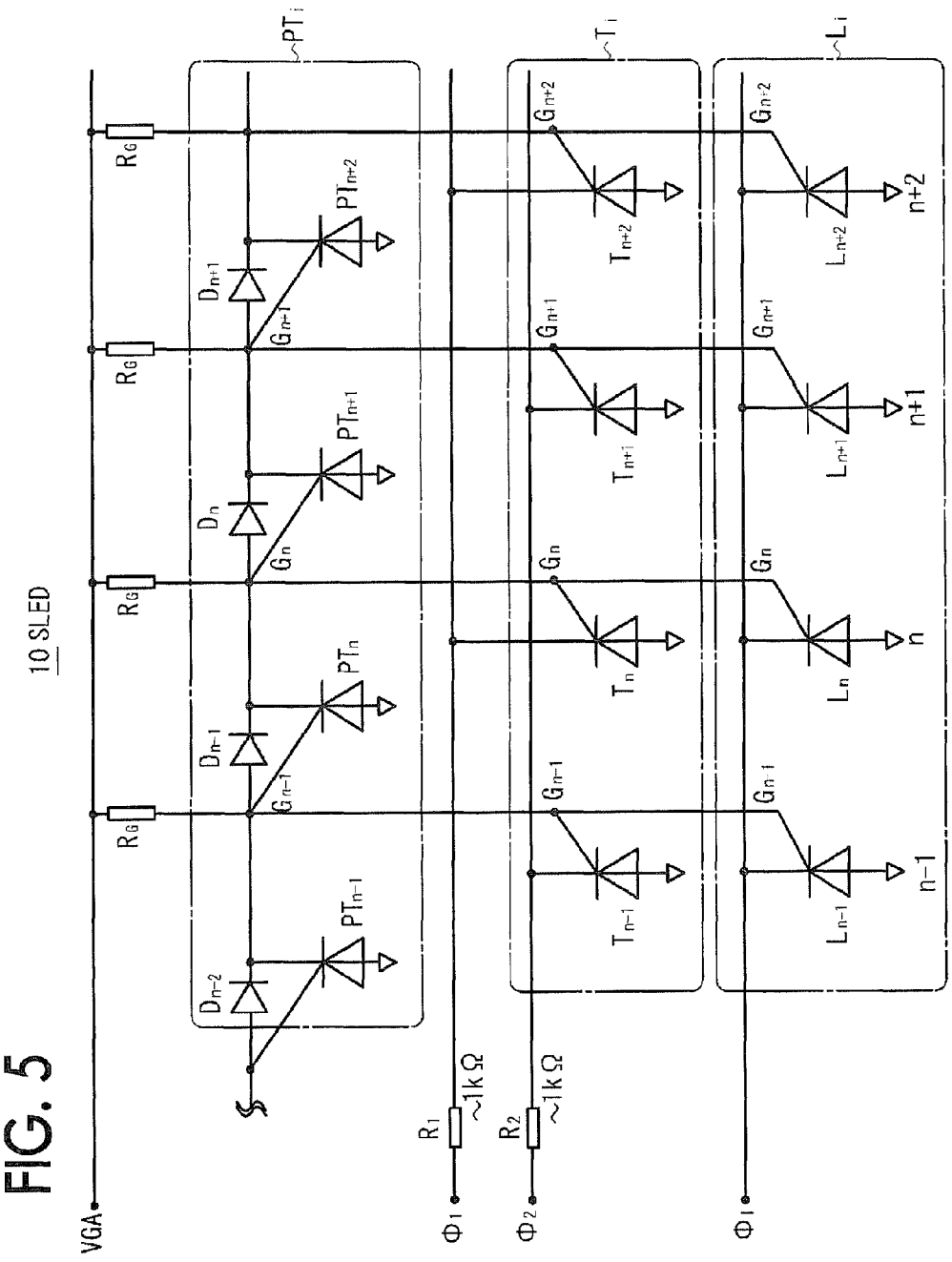
FIG. 5 is an equivalent circuit of a self-scanning light-emitting thyristor array according to a first example of the present invention.

FIG. 1 is a plan view of a part of an SLED according to an exemplary embodiment of the present invention, FIGS. 2A to 2C are cross-sectional views taken along lines A1-A1, A2-A2, and A3-A3, of one island of the SLED illustrated in FIG. 1, FIG. 3 is a cross-sectional view taken along line B-B, FIG. 4 is a plan view for explaining an island having first and second mesa structures M1 and M2, and FIG. 5 is an equivalent circuit of the SLED illustrated in FIG. 1.

Referring to FIG. 5, the equivalent circuit of four light-emitting elements is illustrated as a part of an SLED 10. In the equivalent circuit, Ln−1, Ln, Ln+1, and Ln+2 are light-emitting thyristors, Tn−1, Tn, Tn+1, and Tn+2 are shift thyristors, Gn−1, Gn, Gn+1, and Gn+2 are the common gates of the light-emitting thyristors and the shift thyristors, $R_G$ is a gate load resistor, Dn−2, Dn−1, Dn, and Dn+1 are coupling diodes, PTn−1, PTn, PTn+1, and PTn+2 are parasitic thyristors formed immediately below the cathode electrodes of the coupling diodes, φ1 is an odd-bit transfer line, φ2 is an even-bit transfer line, φI is an emission signal line, and VGA is a gate line. Here, n is a positive integer. In the following description, the light-emitting thyristors, the shift thyristors, and the parasitic thyristors are collectively referred to as a light-emitting thyristor Li, a shift thyristor Ti, and a parasitic thyristor PTi, respectively.

A transfer function of the SLED will be described. Now, it is assumed that the shift thyristor Tn is in the ON state. In this case, the potential of the gate Gn of the shift thyristor Tn increases up to about −0.2 V, and a potential difference of about 1.5 V corresponding to a diffusion potential occurs between both ends of the coupling diode Dn. Thus, Gn+1=Gn−1.5 V=−1.7 V, and Gn+2=Gn+1−1.5 V=−3.2 V.

Figure 6:
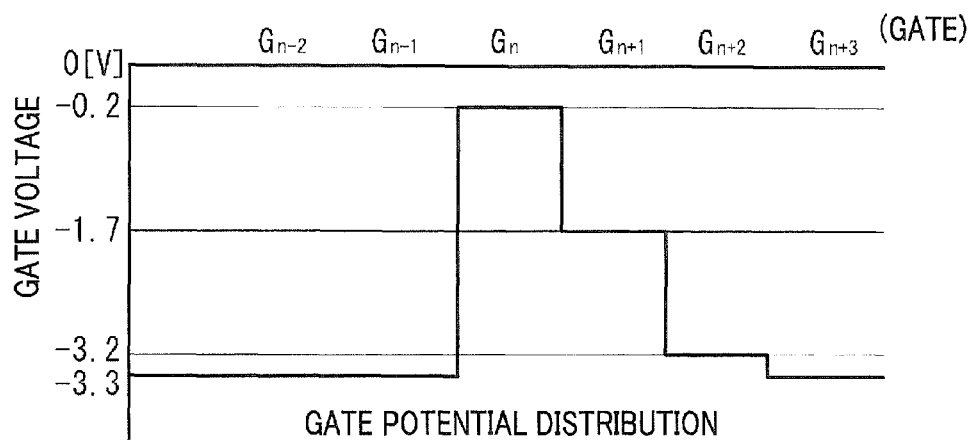
FIG. 6 is a diagram illustrating a gate potential distribution when a shift thyristor Tn generates a firing pulse.
Figure 7:
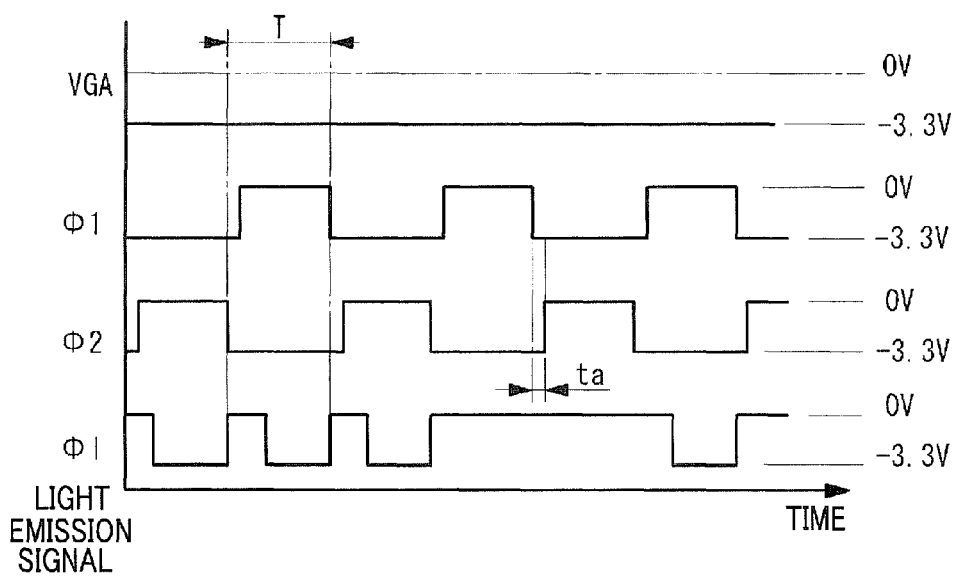
FIG. 7 is a diagram illustrating voltage waveforms of signals applied from the outside.

FIG. 6 illustrates a potential distribution when the shift thyristor Tn generates a firing pulse. Moreover, FIG. 7 illustrates a voltage waveform of the gate line VGA supplied to the gate and a rectangular voltage having a cycle of T supplied to the odd-bit transfer line φ1, the even-bit transfer line φ2, and the emission signal line φI. A period where both the odd-bit transfer line φ1 and the even-bit transfer line φ2 are in the low level is referred to as an overlapping period, which is denoted as "ta."

When the voltage of the gate line VGA and the voltage supplied to the transfer lines φ1, φ2, and φI are set to −3.3 V, a voltage of about 0.1 V is applied between the gate and the cathode of the shift thyristor Tn+2. In order to turn on a thyristor, it is necessary to apply a voltage of a diffusion potential or higher at least between the gate and the cathode and allow an electric current of a holding current or higher to flow between the cathode and the anode. Thus, the shift thyristor Tn+2 may not generate a firing pulse. On the other hand, since a reverse bias is applied to the diode Dn−1 on the left side of the gate Gn, the potential of the gate Gn−1 amounts to about the voltage (about −3.3 V) of the gate line VGA, and the shift thyristor Tn−1 may not be turned on. In this way, when the voltage of the odd-bit transfer line φ1 is −3.3 V, and the shift thyristor Tn is turned on, if the even-bit transfer line φ2 is decreased from 0 V to −3.3 V, only the neighboring shift thyristor Tn+1 generates a firing pulse. After that, when the voltage of the odd-bit transfer line φ1 is increased to 0 V, the shift thyristor Tn is turned off, and the ON state may be transferred from the shift thyristor Tn to the shift thyristor Tn+1.

When the shift thyristor Tn is in the ON state, the gate potential Gn is raised to the highest voltage. Thus, when the odd-bit transfer line φ1 is decreased from 0 V to −3.3 V, only the light-emitting thyristor Ln is turned on and lit. In this way, the firing state is sequentially transferred from the left side of the column of shift thyristors to the right side. Only the light-emitting thyristors corresponding to a bit in which the shift thyristors are in the ON state are selectively turned on depending on the data 0 or 1 input to the emission signal line φI from the outside. In this way, the data 0 or 1 is converted into emission or non-emission information.

FIG. 1 illustrates a plan view of an element array corresponding to the 4-bit element illustrated in FIG. 5. An SLED is configured to include a p-type GaAs semiconductor substrate and a pnpn-type semiconductor layer that is epitaxially grown on the semiconductor substrate so that lattice matching is realized. The semiconductor layer is etched, so that islands, namely mesa structures corresponding to respective elements are formed on the semiconductor substrate. In FIG. 1, four islands Sn−1, Sn, Sn+1, and Sn+2 are formed in correspondence to the circuit of FIG. 5 and are arranged in linear form. In one island, the light-emitting thyristor Li, the shift thyristor Ti, and the coupling diode Di are formed. Moreover, since a pn-layer is present immediately below the coupling diode Di, the parasitic thyristor PTi is formed therein.

The odd-bit transfer line φ1 is connected to cathode electrodes 32T of the shift thyristors of odd-bit islands Sn and Sn+2, and the even-bit transfer line φ2 is connected to cathode electrodes 32T of the shift thyristors of even-bit islands Sn−1 and Sn+1. The emission signal line φI is connected to a cathode electrode 32L of the light-emitting thyristor. Moreover, an island SR connected to the gate line VGA is formed on the substrate. The gate line VGA is electrically connected to a p-type gate layer 26 of the island SR via a contact electrode CT, and the gate load resistor $R_G$ is formed using the p-type gate layer 26. An output terminal of the gate load resistor $R_G$ is connected to the common gate electrode via the contact electrode CT1 and is connected to a cathode electrode 32PT of the adjacent coupling diode.

FIGS. 2A to 2C and FIG. 3 illustrate the cross-sections of the light-emitting thyristor Ln+1, the shift thyristor Tn+1, the coupling diode Dn+1, and the parasitic thyristor PTn+2 formed on a representative island Sn+1. A distributed Bragg reflector (DBR) 21 in which multiple pairs of p-type AlGaAs layers with different Al contents are stacked, an anode layer 22 formed of p-type AlGaAs having a predetermined thickness and a predetermined impurity concentration, an n-type gate layer 24 formed of n-type AlGaAs having a predetermined thickness and a predetermined impurity concentration, a p-type gate layer 26 formed of p-type AlGaAs having a predetermined thickness and a predetermined impurity concentration, and a cathode layer 28L of the light-emitting thyristor Ln+1, a cathode layer 28T of the shift thyristor Tn+1, and a cathode layer 28PT of the coupling diode Dn+1 formed of n-type GaAs or AlGaAs having a predetermined thickness and a predetermined impurity concentration are formed on a p-type GaAs substrate 20. Moreover, cathode electrodes 32L, 32T, and 32PT are formed on and electrically connected to the respective cathode layers 28L, 28T, and 28PT, and a common anode electrode 40 that supplies a ground potential is formed on the rear surface of the substrate 20.

A current confining layer 30 formed of p-type AlAs (or p-type AlGaAs having an Al content ratio of 98% or higher, for example) is inserted in a part of the anode layer 22. Preferably, in the anode layer 22, the current confining layer 30 is sandwiched by AlGaAs layers having a relatively small Al content. Further, the Al content in the AlAs (or AlGaAs) constituting the current confining layer 30 is remarkably greater than the Al content in the other semiconductor layers 24, 26, and 28L.

The uppermost n-type cathode layer is processed into a rectangular pattern by a photolithography process, whereby the cathode layers 28L, 28T, and 28PT of the light-emitting thyristor Ln+1, the shift thyristor Tn+1, and the coupling diode Dn+1 are formed. Preferably, the cathode electrode 32L is formed in a relatively small area in relation to the cathode layer 28L, and light emitted from the light-emitting thyristor Ln+1 is not greatly blocked by the cathode electrode 32L. Moreover, since a greater part of the cathode layer 28T of the shift thyristor Tn+1 is covered by the cathode electrode 32T, light is not emitted from the surface of the cathode layer 28T. As illustrated in FIG. 3, a gate electrode 34 is formed on the p-type gate layer 26 that is exposed by the etching of the cathode layers 28L, 28T, and 28PT. The gate electrode 34 is shared between the light-emitting thyristor Ln+1 and the shift thyristor Tn+1.

Although the rectangular island Sn+1 is formed by etching the semiconductor layer stacked on the substrate, in this exemplary embodiment, it should be noted that the etching is performed in two steps, and the island Sn+1 is formed by two mesa structures M1 and M2 of which the side surfaces have different depths. The first mesa structure M1 is formed in a region where the shift thyristor Tn+1 and the coupling diode Dn+1 are formed. The side surface of the first mesa structure M1 has a depth such that the side surface does not reach at least the current confining layer 30 of the anode layer 22 as illustrated in FIGS. 2B and 2C. Moreover, the second mesa structure M2 is formed in a region where the light-emitting thyristor Ln+1 is formed. The side surface of the second mesa structure M2 has a depth such that the side surface reaches at least the current confining layer 30 of the anode layer 22 as illustrated in FIG. 2A.

FIG. 4 is a plan view of the island Sn+1 for explaining the first and second mesa structures M1 and M2. The formation region of the light-emitting thyristor Ln+1 is on the bottom side of the island Sn+1, and the formation regions of the shift thyristor Tn+1 and the coupling diode Dn+1 are on the central and upper sides of the island Sn+1, respectively. The functions of the light-emitting thyristor Ln+1 and the shift thyristor Tn+1 are divided by the cathode layers 28L and 28T. Thus, the light-emitting thyristor Ln+1 and the shift thyristor Tn+1 may be formed in a region where at least the cathode layers 28L and 28T are provided.

The island Sn+1 has a rectangular shape surrounded by four side surfaces 50, 52, 54, and 56. The shift thyristor Tn+1 and the coupling diode Dn+1 are formed on the side surface 50, apart 52a of the side surface 52 adjacent to the side surface 50, and a part 56a of the side surface 56. These side surfaces 50, 52a, and 56a are formed of the first mesa structure M1. Therefore, the side surfaces 50, 52a, and 56a are etched to a depth such that the side surfaces do not reach the current confining layer 30. On the other hand, the light-emitting thyristor Ln+1 is formed on the side surface 54, a part 52b of the side surface 52 adjacent to the side surface 54, and a part 56b of the side surface 56. These side surfaces 54, 52b, and 56b are formed of the second mesa structure M2. Therefore, the side surfaces 54, 52b, and 56b are etched to a depth such that the side surfaces reach at least the current confining layer 30.

When the substrate including the island Sn+1 is oxidized, the current confining layer 30 in the formation region of the light-emitting thyristor Ln+1 is selectively oxidized from the side surfaces 52b, 54, and 56b, and an oxidized region ($Al_2O_3$) 30A is formed therein. Since the oxidization progresses only a predetermined distance toward the inner side from the three side surfaces 52b, 54, and 56b, the oxidized region 30A having an approximately C-shape is formed in the island Sn+1. A broken line K in FIG. 1 represents the boundary between the oxidized region 30A and a non-oxidized region (conductive region) 30B. The current confining layer 30 including the oxidized region 30A and the non-oxidized region 30B is present immediately below the cathode layer 28L of the light-emitting thyristor Ln+1. The oxidized region 30A is an electrically high-resistance region, and the non-oxidized region 30B is a conductive region. Thus, carriers (holes) having lower mobility than electrons, injected from the anode electrode 40 are confined in the non-oxidized region 30B and are injected to the n-type gate layer 24 in a high density state. As illustrated in FIG. 2A, since the oxidized region 30A is formed at the periphery of the second mesa structure M2, carriers are suppressed from being trapped at the surface level of the side surface of the mesa structure, and thus, a leakage current is suppressed. As a result, the hole-electron recombination probability in the n-type gate layer 24 and the p-type gate layer 26 increases, light emission efficiency is improved, and the output power may be increased.

In contrast, in the first mesa structure M1 where the shift thyristor Tn+1 and the coupling diode Dn+1 are formed, as illustrated in FIGS. 2B and 2C, the depth of the side surface does not reach the current confining layer 30. That is, the current color confining layer 30 is not exposed via the side surface of the first mesa structure M1. Thus, the current confining layer 30 is not oxidized, and the entire current confining layer 30 remains as a conductive region. The shift thyristor Tn+1 and the light-emitting thyristor Ln+1 share the semiconductor layers 22, 24, and 26, and the uppermost cathode layer 28T is separated from the cathode layer 28L of the light-emitting thyristor Ln+1. In this example, the cathode layer 28T is formed in a rectangular shape approximately at the center of the island Sn+1, and the rectangular cathode electrode 32T is formed on the cathode layer 28T. The current confining layer 30 where the oxidized region is not formed is present immediately below the cathode layer 28T, and the area of the conductive region of the current confining layer 30 is not small. Thus, the ON-resistance of the shift thyristor Tn+1 is not affected.

Figure 8A:
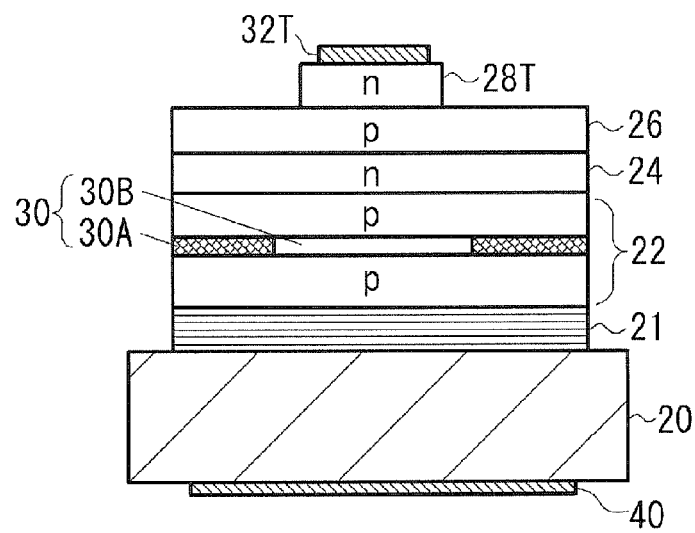
FIGS. 8A and 8B are cross-sectional views of an island according to a comparative example.
Figure 8B:
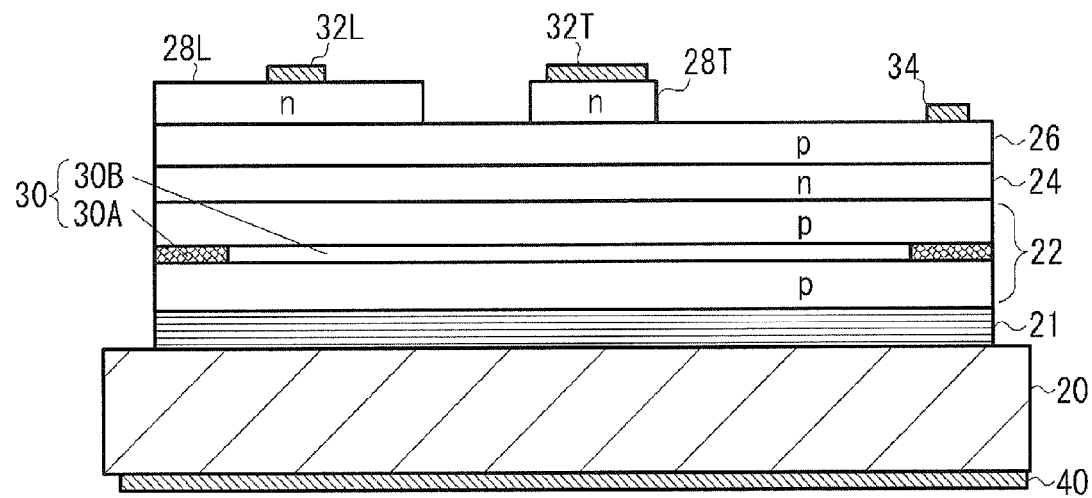

Next, the island Sn+1 of this exemplary embodiment will be compared with the island Sn+1 formed by one step of etching according to a comparative example. FIGS. 8A and 8B are cross-sectional views illustrating the island Sn+1 formed by one step of etching according to the comparative example. Here, the cross-sectional view of FIG. 8A corresponds to the cross-section along line A2-A2 of FIG. 2B of this exemplary embodiment, and the cross-sectional view of FIG. 8B corresponds to the cross-section along line B-B of FIG. 3 of this exemplary embodiment. The island Sn+1 according to the comparative example illustrated in FIGS. 8A and 8B is formed by one step of etching, and the side surface thereof has a depth such that the side surface reaches the substrate 20. Thus, when the island Sn+1 is oxidized, the current confining layer 30 is simultaneously oxidized from the four side surfaces of the island Sn+1. Such a structure has an advantage in that a carrier density in the light-emitting thyristor Ln+1 is increased, so that the light emission quantity increases. However, in the shift thyristor Tn+1, as illustrated in FIG. 8A, since a current path is narrowed by the oxidized region 30A, the ON-resistance between the anode and the cathode increases. As a result, a voltage range where a transfer operation is possible is narrowed. In contrast, in this exemplary embodiment, since the oxidized region 30A is not formed in the shift thyristor Tn+1, an increase in the ON-resistance may be prevented.

Figure 9A:
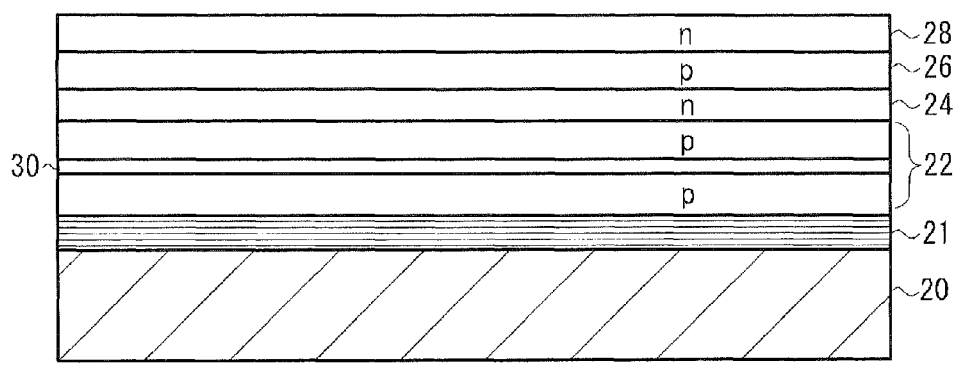
FIGS. 9A to 9C are cross-sectional views illustrating an example of the steps of manufacturing a SLED according to an example of the present invention.

Next, a method of manufacturing the SLED according to this exemplary embodiment will be described with reference to FIGS. 9A to 10C. The cross-sectional views illustrated in FIGS. 9A to 10C correspond to the cross-section taken along line B-B of the island illustrated in FIG. 3. First, as illustrated in FIG. 9A, the p-type DBR 21, the anode layer 22 formed of p-type AlGaAs in which the current confining layer 30 formed of p-type AlAs is inserted, the n-type gate layer 24 formed of n-type AlGaAs, the p-type gate layer 26 formed of p-type AlGaAs, and the cathode layer 28 formed of n-type GaAs or AlGaAs are stacked on the substrate 20 formed of p-type GaAs according to an MOCVD method.

Figure 9B:
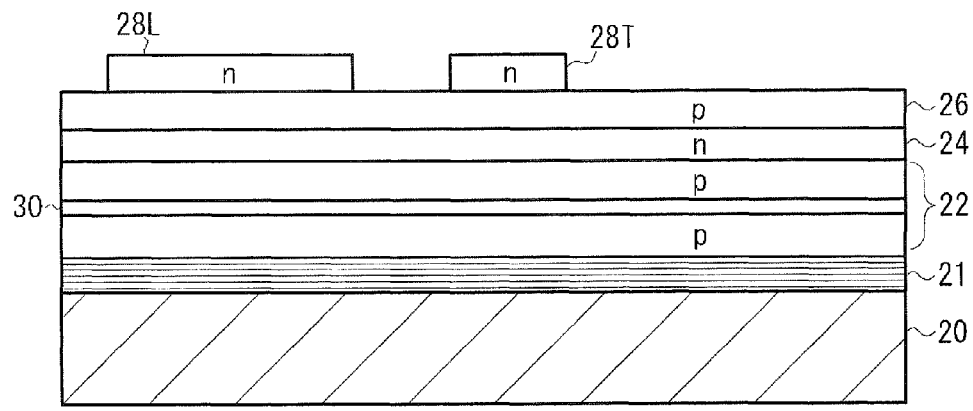
Figure 9C:
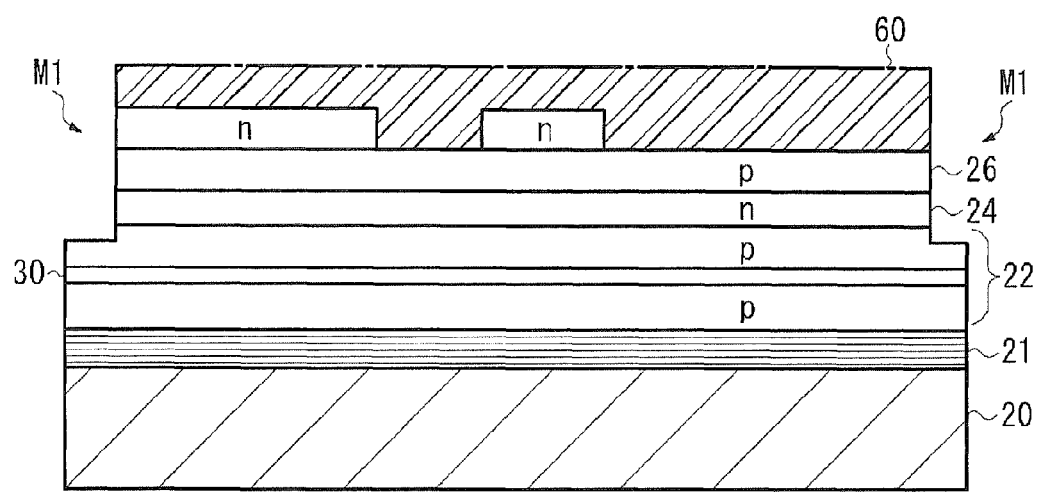

Subsequently, as illustrated in FIG. 9B, the uppermost cathode layer is patterned by a known photolithography process, whereby the cathode layer 28L of the light-emitting thyristor and the cathode layer 28T of the shift thyristor are formed. Subsequently, as illustrated in FIG. 9C, a mask pattern 60 is formed by a photolithography process, and a semiconductor layer is wet-etched so that the first mesa structure M1 may be formed using the mask pattern 60. In this case, the etching depth is controlled so as to exceed the p-type gate layer 26 and the n-type gate layer 24 without reaching the current confining layer 30 of the anode layer 22. In this way, an island including the side surfaces of the first mesa structure M1 is formed. However, in this stage, the four side surfaces 50, 52, 54, and 56 (see FIG. 4) surrounding the island have the same depth. In the wet-etching, a mixed solution of sulfuric acid and oxygenated water is used, for example.

Figure 10A:
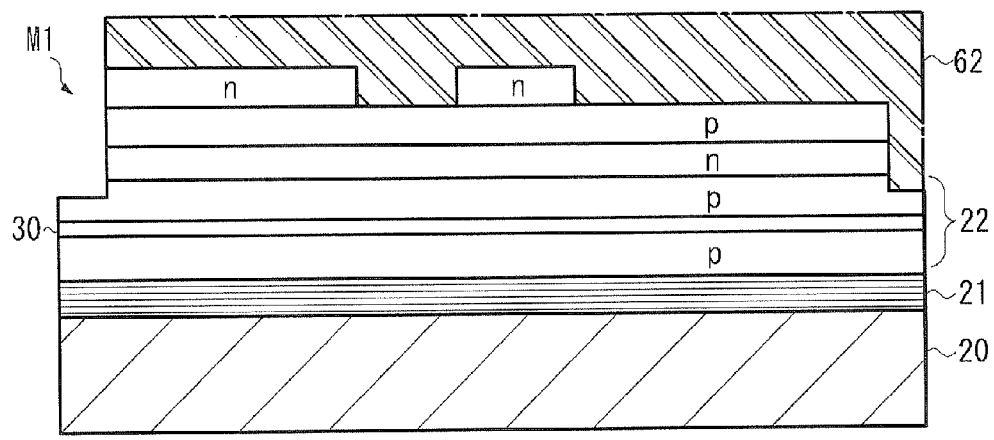
FIGS. 10A to 10C are cross-sectional views illustrating an example of the steps of manufacturing an SLED according to an example of the present invention.
Figure 10B:
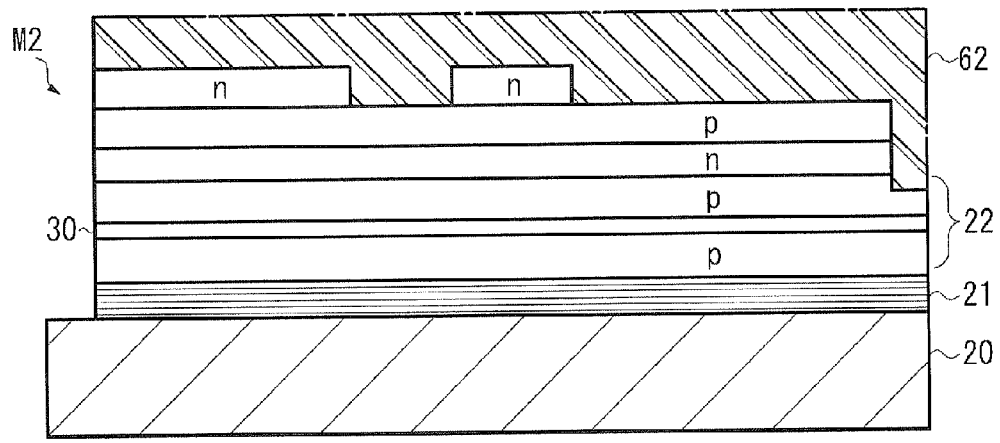
Figure 10C:
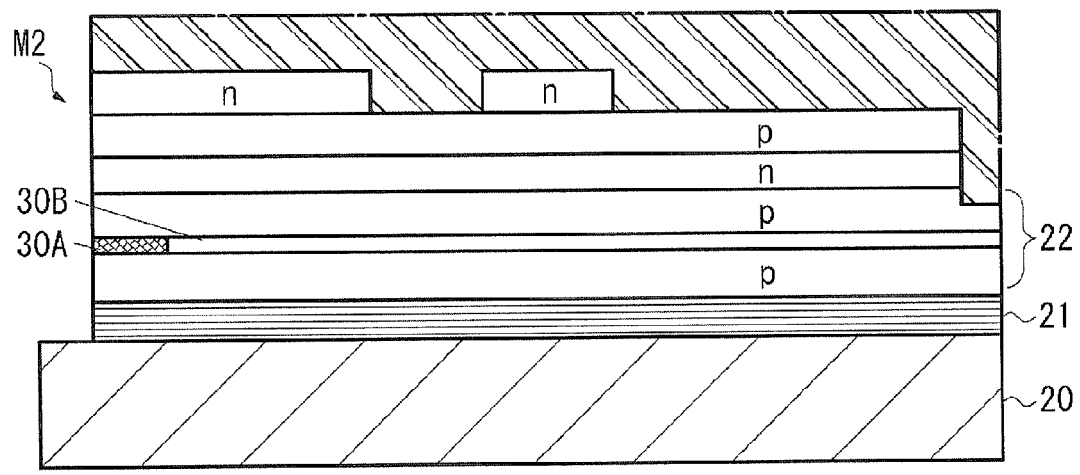

After removing the mask pattern 60, as illustrated in FIG. 10A, a mask pattern 62 is formed such that the side surfaces 52b, 54, and 56b (see FIG. 4) in the formation region of the light-emitting thyristor are exposed. Subsequently, the side surfaces 52b, 54, and 56b in the formation region of the light-emitting thyristor are removed by anisotropic dry-etching using the mask pattern 62, whereby the side surfaces of the second mesa structure M2 are formed. In this way, the current confining layer 30 is exposed in the side surfaces 52b, 54, and 56b in the formation region of the light-emitting thyristor, whereas the current confining layer 30 is not exposed in the side surfaces 50, 52a, and 56a in the formation region of the shift thyristor. In this case, boron chloride is used as an etchant, for example. Subsequently, the substrate is oxidized by vapor oxidation-annealing, whereby the current confining layer 30 exposed from the side surfaces of the second mesa structure M2 is selectively oxidized, and the oxidized region 30A formed of $Al_2O_3$ is formed. Subsequently, the mask pattern 62 is removed, and a cathode electrode, an anode electrode, and a gate electrode are formed by a lift-off process. The cathode electrode and the gate electrode may be formed before the first mesa structure M1 is formed.

Figure 11A:
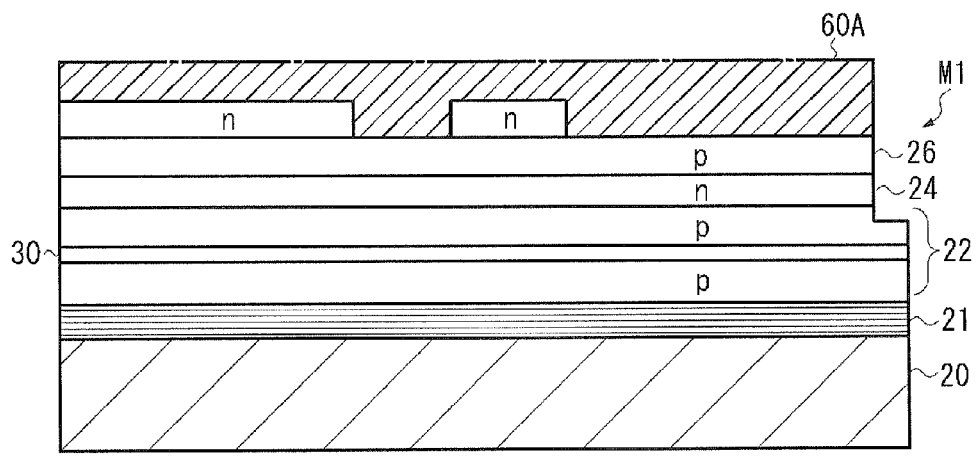
FIGS. 11A and 11B are cross-sectional views illustrating another example of the steps of manufacturing an SLED according to an example of the present invention.

Next, another example of the steps of manufacturing the SLED according to this exemplary embodiment will be described. After the cathode layers 28L and 28T are patterned as illustrated in FIG. 9B, a mask pattern 60A is formed such that the formation region of the shift thyristor is exposed, and wet-etching is performed using the mask pattern 60A as illustrated in FIG. 11A. In this way, the first mesa structure M1 including the side surfaces 50, 52a, and 56a in the formation region of the shift thyristor is formed. In this case, a mixed solution of sulfuric acid and oxygenated water is used as an etchant, for example.

Figure 11B:
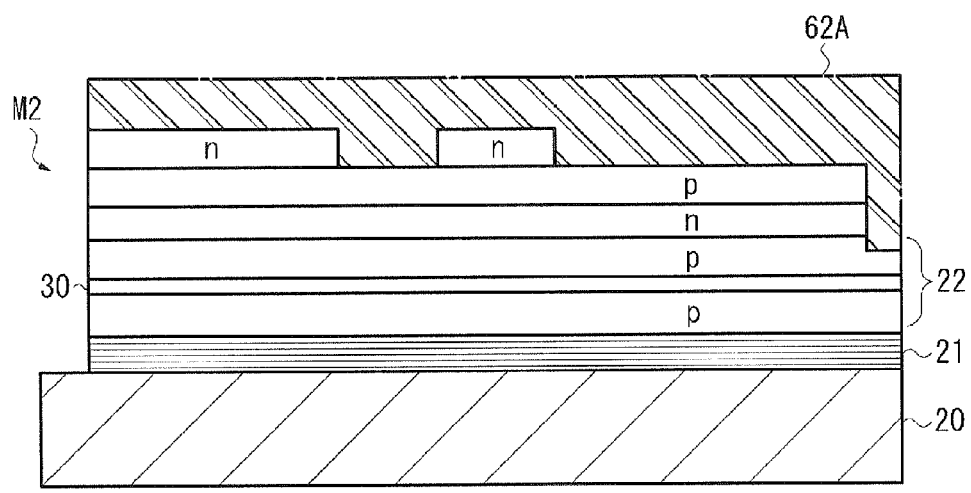

After removing the mask pattern 60A, as illustrated in FIG. 11B, a mask pattern 62A is formed such that the formation region of the shift thyristor is covered and the formation region of the light-emitting thyristor is exposed, and anisotropic dry-etching is performed. In this way, the second mesa structure M2 including the side surfaces 52b, 54, and 56b in the formation region of the light-emitting thyristor is formed. In this case, boron chloride is used as an etchant, for example.

Figure 12A:
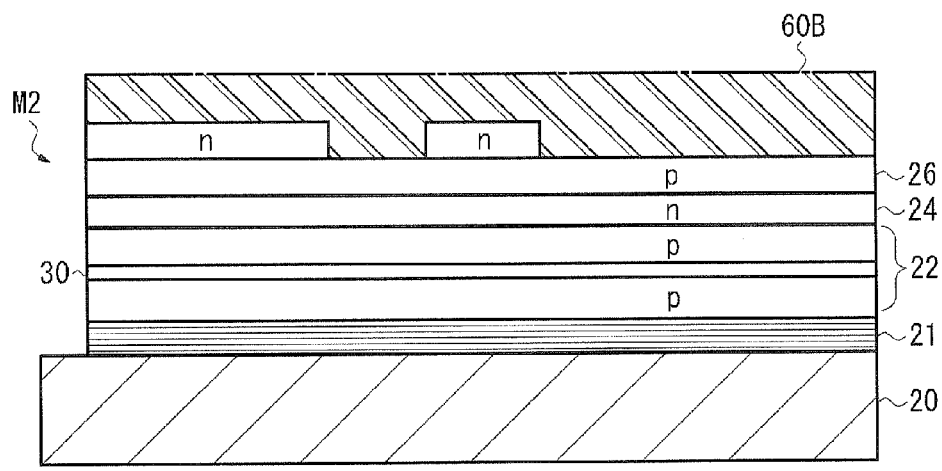
FIGS. 12A and 12B are cross-sectional views illustrating another example of the steps of manufacturing an SLED according to an example of the present invention.
Figure 12B:
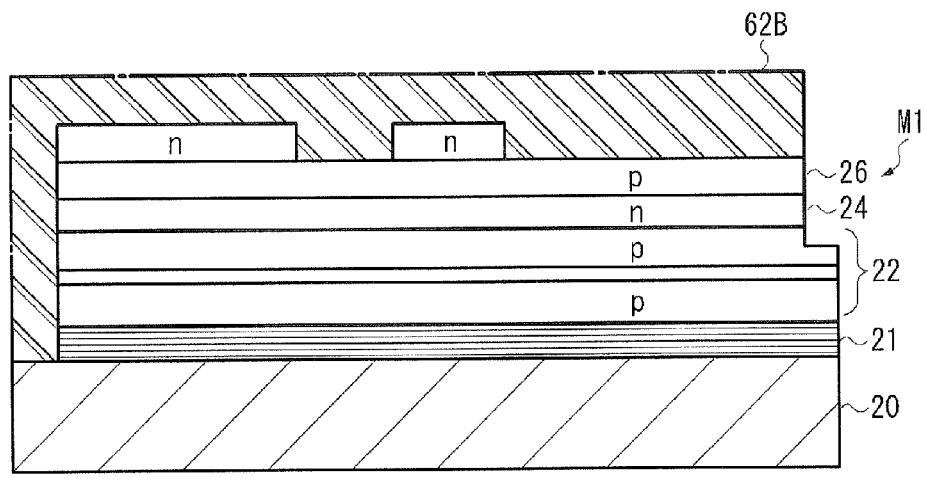

In the manufacturing steps illustrated in FIGS. 12A and 12B, the order of the etching steps of FIGS. 11A and 11B is changed. As illustrated in FIG. 12A, a mask pattern 60B is formed such that the formation region of the light-emitting thyristor is exposed, and the semiconductor layer is anisotropically dry-etched using the mask pattern 60B. In this way, the second mesa structure M2 including the side surfaces 52b, 54, and 56b in the formation region of the light-emitting thyristor is formed. In this case, boron chloride is used as an etchant, for example.

After removing the mask pattern 60B, a mask pattern 62B is formed such that the formation region of the shift thyristor is exposed, and wet-etching is performed using the mask pattern 62B. In this way, the first mesa structure M1 including the side surfaces 50, 52a, and 56a in the formation region of the shift thyristor is formed. In this case, a mixed solution of sulfuric acid and oxygenated water is used as an etchant, for example.

As above, in this exemplary embodiment, the first mesa structure M1 that forms the region of the shift thyristor is formed by wet-etching, and the second mesa structure M2 that forms the region of the light-emitting thyristor is formed by dry-etching. The advantages of this combination of etching will be described below.

Figure 13A:
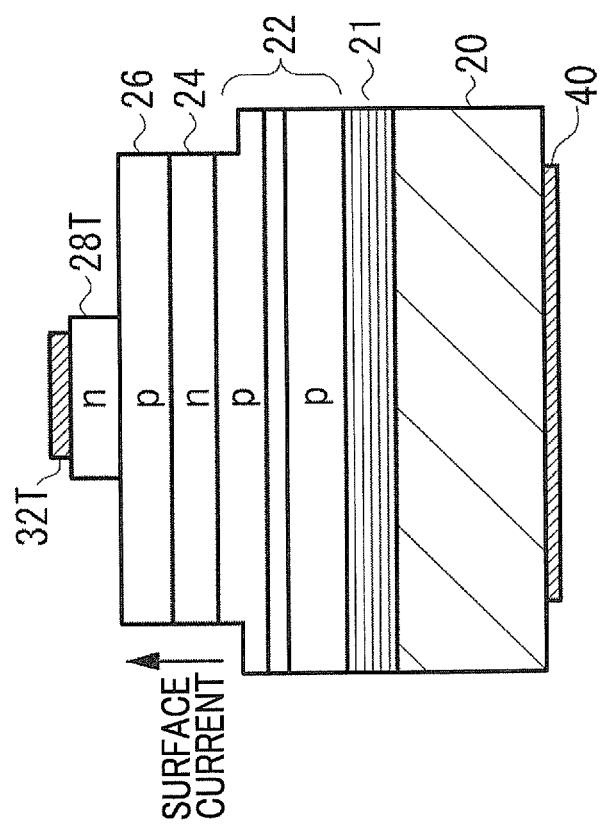
FIG. 13A is a diagram for explaining a surface current when a mesa surface of an active layer is formed by dry-etching.
Figure 13B:
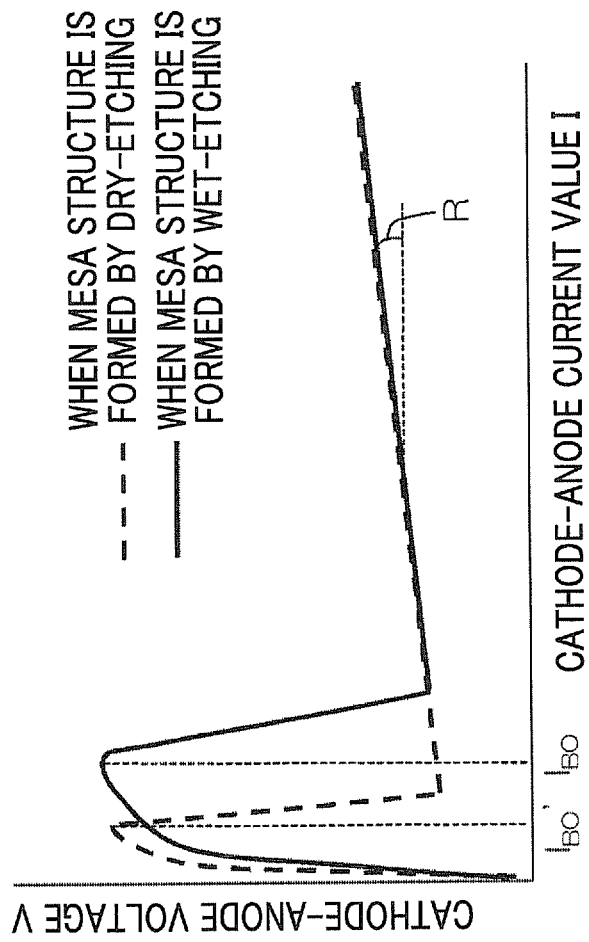
FIG. 13B is a graph illustrating a threshold current when a mesa surface of an active layer is formed by dry-etching.
Figure 13B:
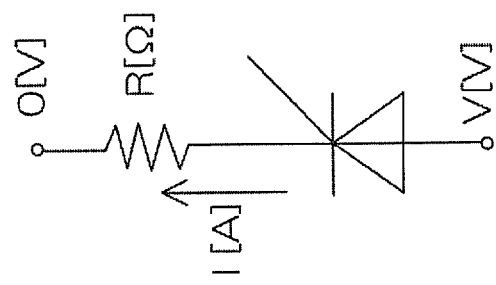

When a mesa surface in which an active layer (that is, the n-type gate layer 24 and the p-type gate layer 26) of a thyristor is formed by dry-etching, a surface current easily flows on the mesa surface of the active layers 24 and 26 as illustrated in FIG. 13A unless an appropriate surface treatment is performed. Thus, as illustrated in FIG. 13B, a threshold current value necessary for turning on a pnpn-type thyristor when the mesa surface of the active layer is formed by dry-etching is lower than that when the mesa surface of the active layer is formed by wet-etching. Thus, the thyristor is easily turned on.

Figure 14:
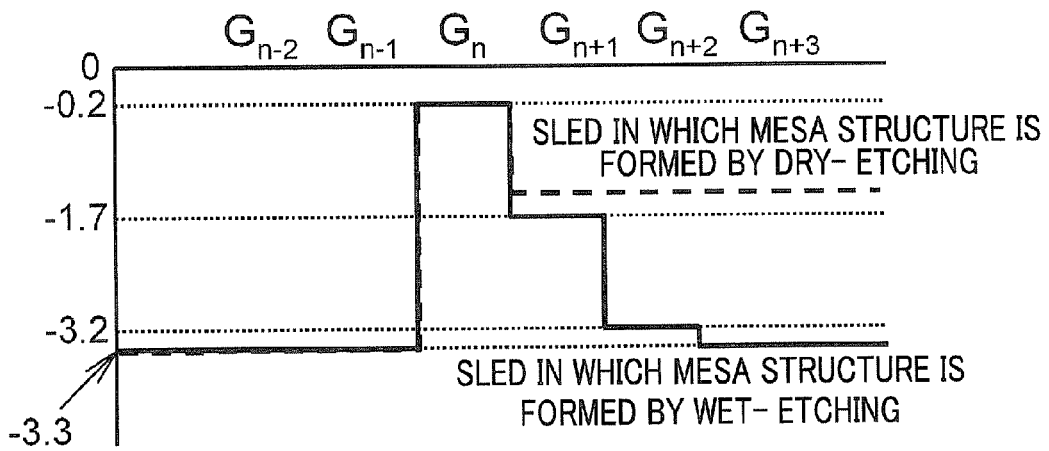
FIG. 14 is a graph illustrating a gate potential distribution when a mesa surface of an active layer is formed by dry-etching and wet-etching.

The fact that the thyristor is easily turned on is good for the light-emitting thyristor Li, but it may not be said that the fact is also good for the shift thyristor Ti. That is, in an SLED circuit, if the parasitic thyristor PTi present immediately below the coupling diode Di that determines the gate potential of each bit is easily turned on, the stepwise gate potential distribution determined by the coupling diode Di is destroyed, so that a proper transfer operation is not possible. FIG. 14 illustrates a gate potential (denoted by a broken line) when the mesa surface of the active layer is formed by dry-etching and a gate potential (denoted by a solid line) when the mesa surface of the active layer is formed by wet-etching.

Figure 15:
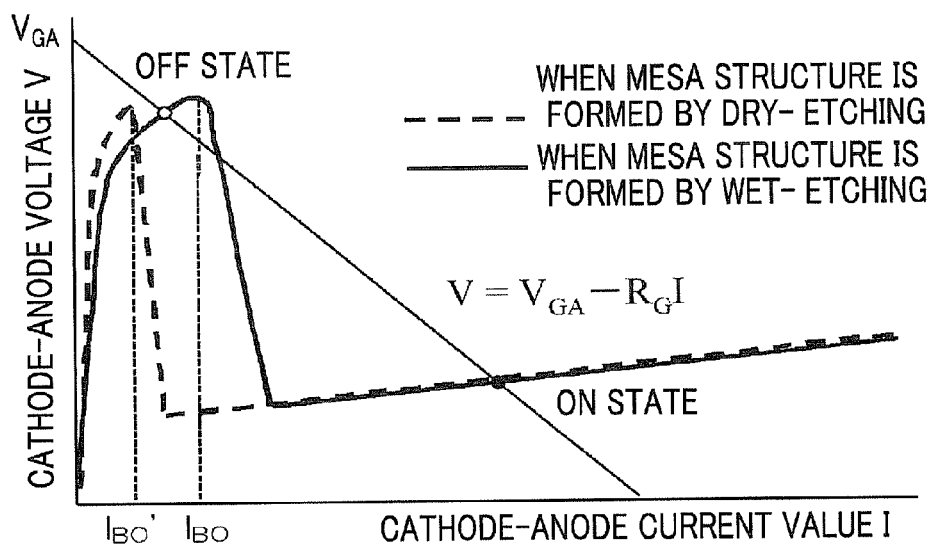
FIG. 15 is a graph illustrating an operating point analysis of a parasitic thyristor.
Figure 16:
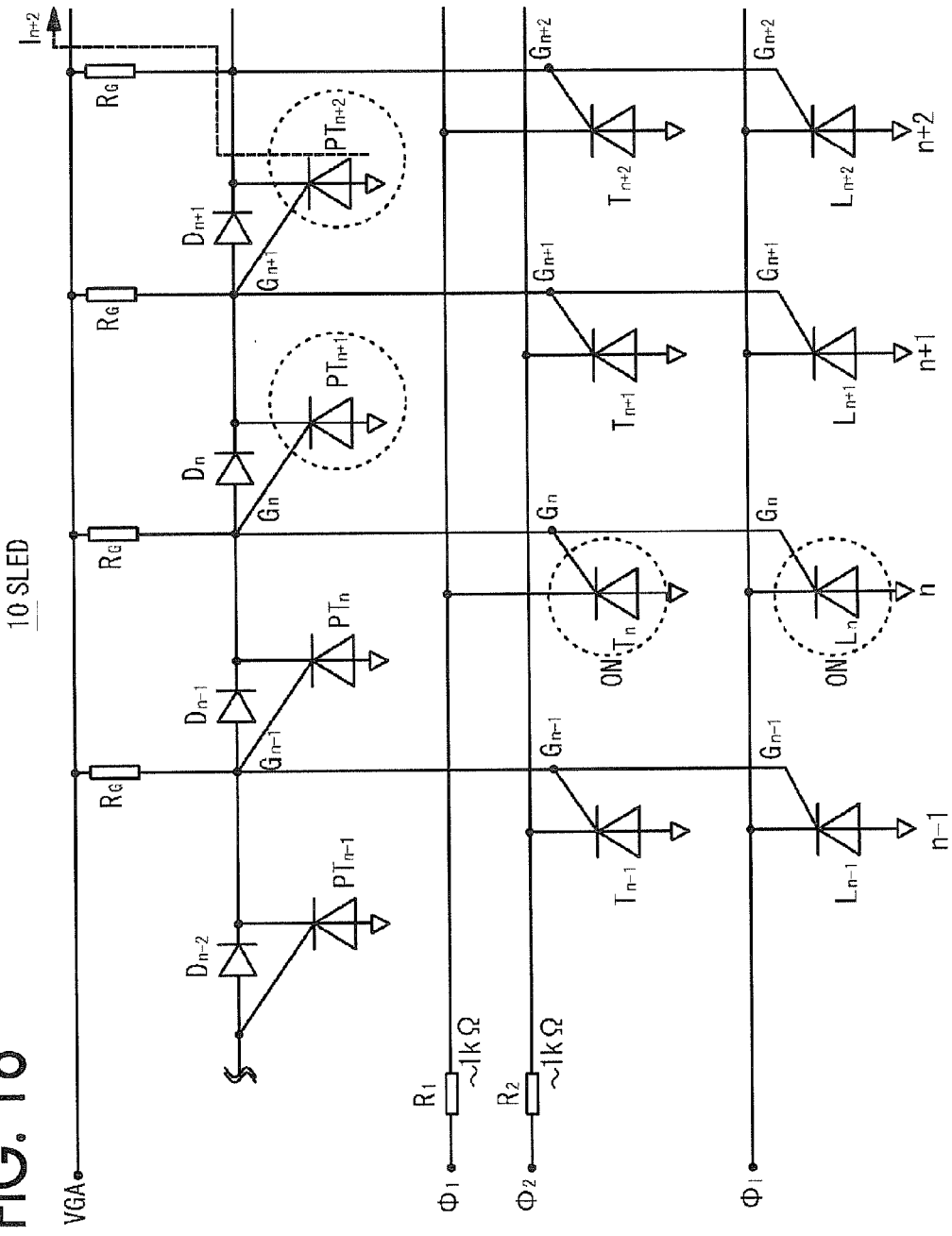

For example, as illustrated in FIG. 16, when the light-emitting thyristor Ln and the shift thyristor Tn are turned on, the gate potential Gn+1 of the adjacent bit is about −1.7 V due to the coupling diode Dn. Here, if the parasitic thyristor PTn+1 is turned on, the gate potential Gn+1 increases to about −1.5 V. In this case, the gate potential of the parasitic thyristor PTn+2 of the adjacent bit becomes −1.5 V, and the cathode potential thereof becomes −3.0 V. When the mesa surface of the active layer is formed by dry-etching, and the threshold current value is low, looking at a current path (closed circuit) indicated by arrow In+2 of FIG. 16, the operating point of the parasitic thyristor PTn+2 transitions to the ON state rather than the OFF state as illustrated in FIG. 15. Thus, the parasitic thyristor PTn+2 is turned on, and at the same time, the shift thyristor Tn+2 also generates a firing pulse since the gate potential thereof is about −1.5 V. As a result, a sequential transfer operation is not performed.

The above is the reason why the shift thyristor is formed by wet-etching when the formation regions of the shift thyristor and the light-emitting thyristor in an island are etched in two steps.

On the other hand, the mesa structure in the AlAs layer (current confining layer) or the DBR may be formed by dry-etching. If the Al content is large, and a mixed solution of sulfuric acid and oxygenated water is used as an etchant, the etching rate is very high so that the side surfaces of the mesa structure have an overhang shape (a constricted shape). Thus, when a layer such as an insulating film is formed on the side surfaces, the coverage may be degraded, and the reliability may deteriorate.

Due to this point, in this exemplary embodiment, in order to maintain the ON-resistance of the shift thyristor to be low and to suppress an abnormality of a transfer operation due to the surface current flowing on the active layer without narrowing a transfer voltage range, the mesa structure in the active layer of the shift thyristor is formed by wet-etching, and the mesa structure in the AlAs layer and the DBR is formed by dry-etching.

In the above exemplary embodiment, although the current confining layer 30 is formed in the anode layer 22, the current confining layer 30 may be formed at another position. For example, the current confining layer 30 may be formed at the boundary between the n-type gate layer 24 and the anode layer 22. Further, in this exemplary embodiment, although the island has a rectangular shape in a plan view thereof, this is only an example, and the island may have other shapes, for example, a circular shape, an elliptical shape, a trapezoidal shape, and other polygonal shapes.

Figure 17:
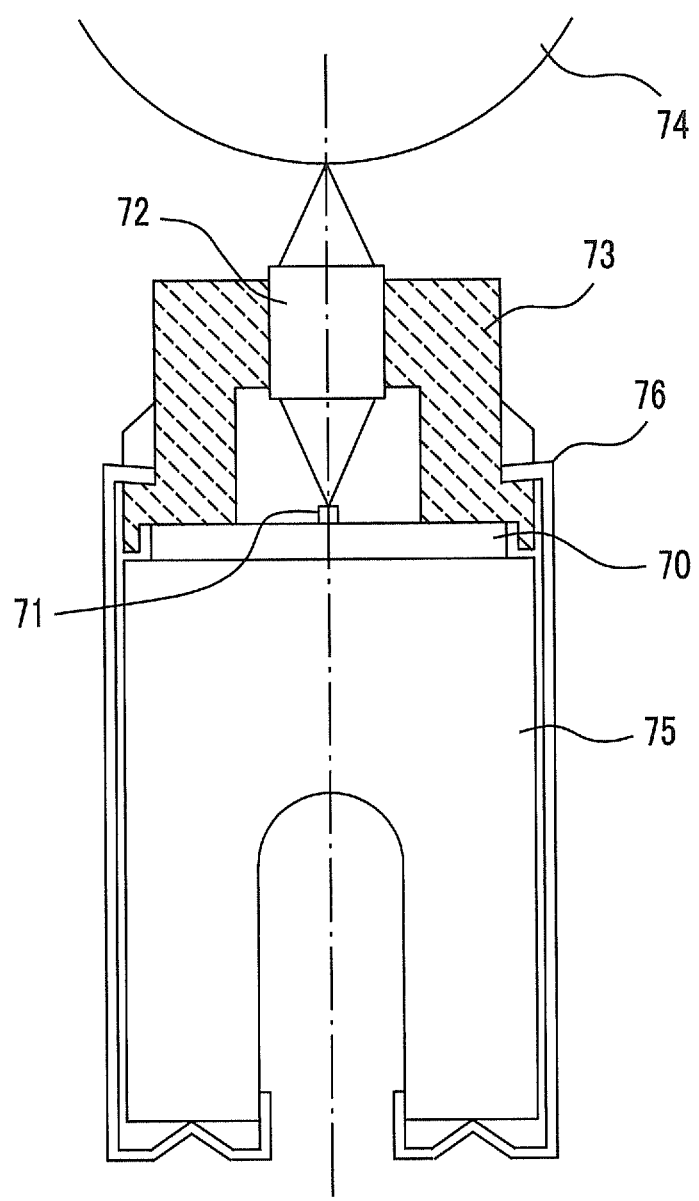
FIG. 17 is a diagram illustrating an example of the structure of an optical writing head to which the self-scanning light-emitting element array according to this exemplary embodiment is applied.

The self-scanning light-emitting element array described above is used in an optical writing head of an optical printer, for example. FIG. 17 illustrates an example of an optical writing head using a self-scanning light-emitting element array. Multiple light-emitting element array chips 71 on which light-emitting thyristors are disposed in an array form are mounted on a chip-mounting substrate 70 in a main scanning direction. A rod lens array 72 of an erecting unit magnification system, extending in the main scanning direction is fixed to the optical path of light emitted by the light-emitting elements of the light-emitting element array chip 71 by a resin housing 73. A photosensitive drum 74 is formed on the optical axis of the rod lens array 72. Moreover, a heat sink 75 for discharging the heat of the light-emitting element array chip 71 is formed on the base of the chip-mounting substrate 70, and the housing 73 and the heat sink 75 are fixed by a clamping bracket 76 with the chip-mounting substrate 70 interposed.

Figure 18:
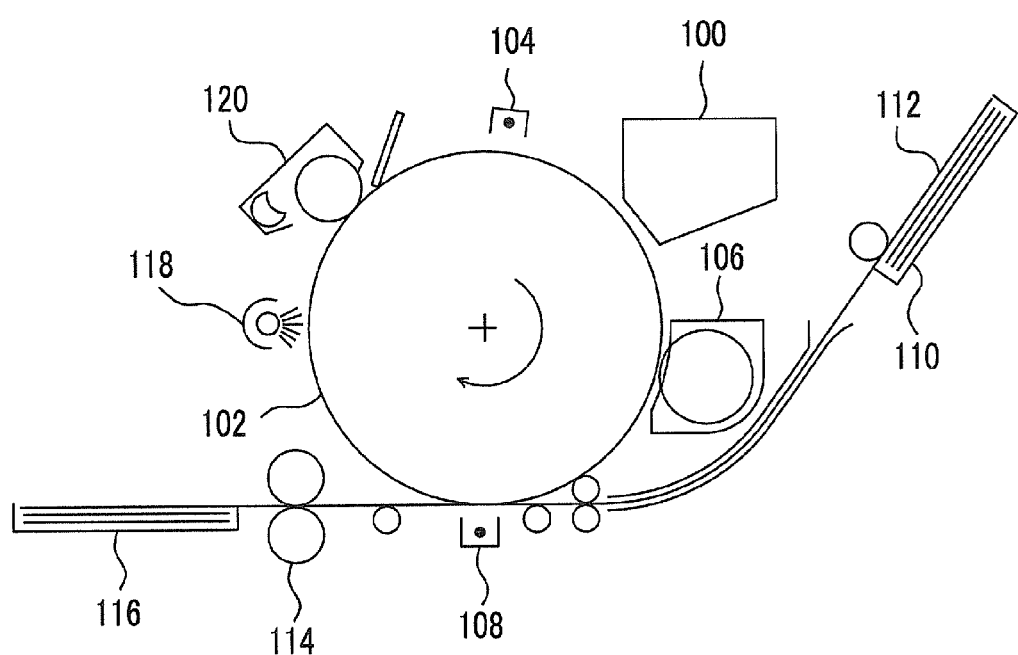
FIG. 18 is a diagram illustrating an application example in which an optical writing head using the self-scanning light-emitting element array according to this exemplary embodiment is applied to an optical printer.

FIG. 18 illustrates an optical printer that uses the optical writing head illustrated in FIG. 17. An optical writing head 100 is provided in the optical printer. A light-conductive material (photosensitive material) such as amorphous Si is formed on the surface of a cylindrical photosensitive drum 102. This photosensitive drum 102 rotates at the printing speed. The surface of the rotating photosensitive drum 102 is uniformly charged by a charging device 104. Moreover, the optical writing head 100 irradiates the photosensitive material with the light corresponding to the dot images to be printed, and the charged portions of the photosensitive material are neutralized by the irradiated light, whereby a latent image is formed. Subsequently, a developing device 106 causes toner to be attached to the photosensitive material depending on the state of the charge on the photosensitive material. Then, a transfer device 108 transfers the toner to a sheet 112 transported from a cassette 110. The sheet 112 is heated and fixed by a fixing device 114 and is then conveyed to a stacker 116. After the transfer process ends, the entire surface of the charged photosensitive drum 102 is neutralized by an erasing lamp 118, and the remaining toner on the photosensitive drum 102 is removed by a cleaning device 120. Such an optical writing head may be used in an image forming apparatus such as a facsimile or a copier as well as the printer.

While preferable exemplary embodiments of the present invention have been described, the present invention is not limited to a specific exemplary embodiment, and various modifications and changes are possible within the scope of the invention described in the claims.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light-emitting element comprising:
a semiconductor substrate;
an island structure formed on the semiconductor substrate and including at least a current confining layer and p-type and n-type semiconductor layers;
a light-emitting thyristor formed in the island structure and having a pnpn structure; and
a shift thyristor formed in the island structure and having a pnpn structure, wherein
the island structure includes a first side surface having a first depth such that the first side surface does not reach the current confining layer in a formation region of the shift thyristor and a second side surface having a second depth such that the second side surface reaches at least the current confining layer in a formation region of the light-emitting thyristor, and
an oxidized region selectively oxidized from the second side surface is formed in the current confining layer in the formation region of the light-emitting thyristor.

2. The light-emitting element according to claim 1, wherein
a cathode layer of the light-emitting thyristor is separated from a cathode layer of the shift thyristor,
a current confining layer including an oxidized region and a non-oxidized region is present immediately below the cathode layer of the light-emitting thyristor, and
a current confining layer of the non-oxidized region is present immediately below the cathode layer of the shift thyristor.

3. The light-emitting element according to claim 1, wherein
the island structure has a rectangular shape having four side surfaces,
the first side surface includes one side surface and two partial side surfaces adjacent thereto, and the shift thyristor is formed in a region surrounded by the three side surfaces, and
the second side surface includes one side surface and two partial side surfaces adjacent thereto, and the light-emitting thyristor is formed in a region surrounded by the three side surfaces.

4. The light-emitting element according to claim 2, wherein
the island structure has a rectangular shape having four side surfaces,
the first side surface includes one side surface and two partial side surfaces adjacent thereto, and the shift thyristor is formed in a region surrounded by the three side surfaces, and
the second side surface includes one side surface and two partial side surfaces adjacent thereto, and the light-emitting thyristor is formed in a region surrounded by the three side surfaces.

5. The light-emitting element according to claim 1, wherein
the current confining layer is formed in an anode layer of the light-emitting thyristor and the shift thyristor,
the first side surface has a first depth such that the first side surface does not reach the current confining layer in the anode layer, and
the second side surface has a second depth such that the second side surface reaches the current confining layer in the anode layer.

6. The light-emitting element according to claim 2, wherein
the current confining layer is formed in an anode layer of the light-emitting thyristor and the shift thyristor,
the first side surface has a first depth such that the first side surface does not reach the current confining layer in the anode layer, and
the second side surface has a second depth such that the second side surface reaches the current confining layer in the anode layer.

7. The light-emitting element according to claim 1, wherein
the first side surface is a wet-etching surface which is wet-etched when forming the island structure, and
the second side surface is a dry-etching surface which is dry-etched when forming the island structure.

8. The light-emitting element according to claim 1, wherein
the light-emitting element further comprises:
a semiconductor multilayer reflecting mirror disposed between the pnpn structure of the light-emitting thyristor and the semiconductor substrate.

9. The light-emitting element according to claim 1, wherein
a diode is formed in the island structure in a region of a pn layer separated from the light-emitting thyristor and the shift thyristor, and
an anode layer of the diode is shared with the gates of the light-emitting thyristor and the shift thyristor.

10. A method of manufacturing a light-emitting element in which a plurality of island structures including at least a current confining layer and p-type and n-type semiconductor layers are formed on a semiconductor substrate, and at least a light-emitting thyristor having a pnpn structure and a shift thyristor having a pnpn structure are formed in one island structure, the method comprising:
when forming the island structure, forming a first side surface having a first depth such that the first side surface does not reach the current confining layer in a formation region of the shift thyristor and forming a second side surface having a second depth such that the second side surface reaches at least the current confining layer in a formation region of the light-emitting thyristor; and
forming an oxidized region selectively oxidized from the second side surface in the current confining layer in the formation region of the light-emitting thyristor.

11. The method according to claim 10, wherein
the first and second side surfaces are formed by two steps of etching.

12. The method according to claim 10, wherein
the first side surface is formed by wet-etching, and the second side surface is formed by dry-etching.

13. The method according to claim 12, wherein
the first side surface has a first depth such that the first side surface reaches at least an active region of the light-emitting thyristor and the shift thyristor.

14. The method according to claim 12, wherein
the island structure includes a semiconductor multilayer reflecting mirror formed on the semiconductor substrate,
the semiconductor multilayer reflecting mirror includes a plurality of pairs of AlGaAs layers having different Al contents,
the current confining layer is an AlAs layer or an AlGaAs layer, and the second side surface has a second depth such that the second side surface reaches at least the semiconductor multilayer reflecting mirror.

15. The method according to claim 10, wherein
a first etching step of forming the first side surface is performed, and then, a second etching step of forming the second side surface is performed.

16. The method according to claim 10, wherein
a first etching step of forming the second side surface is performed, and then, a second etching step of forming the first side surface is performed.

17. The method according to claim 10, wherein
the island structure has a rectangular shape having four side surfaces,
the second side surface includes one side surface and two partial side surfaces adjacent thereto, and
the current confining layer is selectively oxidized from the three side surfaces.

18. A self-scanning light-emitting element array comprising:
a plurality of the light-emitting elements according to claim 1, wherein
a first transfer signal is applied to a cathode layer of the shift thyristor of each of odd-numbered island structures,
a second transfer signal different from the first transfer signal is applied to a cathode layer of the shift thyristor of each of even-numbered island structures, and
the gates of the shift thyristors of the adjacent island structures are electrically connected by the diode.

19. An optical writing head using the light-emitting element array according to claim 18.

20. An image forming apparatus comprising the optical writing head according to claim 19.

* * * * *